(12) United States Patent
Kopp et al.

(10) Patent No.: US 12,733,317 B2
(45) Date of Patent: Sep. 8, 2026

(54) OPTOELECTRONIC SEMICONDUCTOR DEVICE WITH REDUCED LIGHT ABSORPTION AND METHOD FOR MANUFACTURING OF AN OPTOELECTRONIC SEMICONDUCTOR DEVICE WITH REDUCED LIGHT ABSORPTION

(71) Applicant: ams-OSRAM International GmbH, Regensburg (DE)

(72) Inventors: Fabian Kopp, Tanjung Tokong (MY); Attila Molnar, Gelugor (MY); Lutz Hoeppel, Alteglofsheim (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 832 days.

(21) Appl. No.: 17/799,295

(22) PCT Filed: Feb. 17, 2021

(86) PCT No.: PCT/EP2021/053868

§ 371 (c)(1),
(2) Date: Aug. 12, 2022

(87) PCT Pub. No.: WO2021/165309

PCT Pub. Date: Aug. 26, 2021

(65) Prior Publication Data

US 2023/0084844 A1 Mar. 16, 2023

(30) Foreign Application Priority Data

Feb. 18, 2020 (WO) ................. PCT/EP2020/054251

(51) Int. Cl.
*H10H 20/856* (2025.01)
*H10H 20/01* (2025.01)

(52) U.S. Cl.
CPC ....... *H10H 20/856* (2025.01); *H10H 20/0363* (2025.01)

(58) Field of Classification Search
CPC ............. H10H 20/856; H10H 20/0363; H10H 20/8506; H10H 20/82; H10H 20/814
See application file for complete search history.

(56) References Cited

U.S. PATENT DOCUMENTS 6,531,405 B1 * 3/2003 Wegleiter ........... H10H 20/8215 257/E31.13
2012/0248469 A1 10/2012 Choi (Continued)

FOREIGN PATENT DOCUMENTS

| | | | |
|---|---|---|---|
| DE | 102018117018 A1 | | 1/2020 |
| EP | 2991125 A1 | | 3/2016 |
| JP | 08241891 A | * | 9/1996 |

OTHER PUBLICATIONS

International Search Report issued for the corresponding international patent application No. PCT/EP2021/053868, dated Apr. 21, 2021, 3 Pages (for informational purposes only).

(Continued)

*Primary Examiner* — Bumsuk Won
(74) *Attorney, Agent, or Firm* — VIERING, JENTSCHURA & PARTNER mbB

(57) ABSTRACT

An optoelectronic semiconductor device may include a carrier comprising a patterned surface and a semiconductor layer sequence arranged on the carrier. The semiconductor layer sequence may include a first semiconductor layer having a first surface, a second semiconductor layer having a first surface, and a first main surface and a second main surface opposite the first main surface. The first surfaces of the first and second semiconductor layers may be at least partly arranged at the first main surface. The second main surface may face the patterned surface of the carrier, and at (Continued)

least one side face may connect the first and second main surfaces. The device may further include a directionally reflective layer and a planarization layer. The planarization layer may be arranged between the patterned surface and the directionally reflective layer. Moreover, a method for producing an optoelectronic semiconductor device is also disclosed.

17 Claims, 9 Drawing Sheets

(56) References Cited

U.S. PATENT DOCUMENTS

2014/0132569 A1* 5/2014 Lien .................... G06F 3/0446 345/175
2014/0319547 A1 10/2014 Rode
2015/0011031 A1* 1/2015 Cho .................... H10K 50/854 438/29
2016/0093769 A1 3/2016 Vom Dorp et al.
2016/0111600 A1* 4/2016 Chae .................... H10H 20/831 257/99
2016/0211307 A1* 7/2016 Kim .................... H10K 59/80521
2017/0104141 A1 4/2017 Park et al.
2017/0170248 A1* 6/2017 Sato .................... H10K 59/38
2017/0338438 A1* 11/2017 Kwon .................... H10K 59/1213
2018/0106941 A1* 4/2018 Yun .................... G02B 3/005
2018/0294428 A1* 10/2018 Nishimura .................... H10K 59/80516
2021/0328106 A1 10/2021 Kopp et al.
2022/0149243 A1* 5/2022 Wang .................... H10H 20/814

OTHER PUBLICATIONS

International Search Report issued for the corresponding international patent application No. PCT/EP2020/054251, dated Aug. 27, 2020, 2 Pages (for informational purposes only).

Nguyen, S. V., "High-density plasma chemical vapor deposition of silicon-based dielectric films for integrated circuits", IBM Journal of Research & Development, Jan. 1999, pp. 1-19, vol. 43, Issue 1.2, IBM.

Tang, B. et al., "Enhanced Light Extraction of Flip-Chip Mini-LEDs with Prism-Structured Sidewall", Nanomaterials, 2019, pp. 1-8, vol. 9, No. 3, MDPI.

German office action issued for the corresponding German patent application No. 11 2021 001 081.6, dated May 13, 2025, 5 pages (for informational purposes only).

* cited by examiner 1
3A
7
20
8
3C
3
2
3D
II
I

OPTOELECTRONIC SEMICONDUCTOR DEVICE WITH REDUCED LIGHT ABSORPTION AND METHOD FOR MANUFACTURING OF AN OPTOELECTRONIC SEMICONDUCTOR DEVICE WITH REDUCED LIGHT ABSORPTION

CROSS-REFERENCE TO RELATED APPLICATIONS

The present application is a national stage entry according to 35 U.S.C. § 371 of PCT application No.: PCT/EP2021/053868 filed on Feb. 17, 2021; which claims priority to PCT application No.: PCT/EP2020/054251, filed on Feb. 18, 2020; all of which are incorporated herein by reference in their entirety and for all purposes.

TECHNICAL FIELD

This application is related to an optoelectronic semiconductor device as well as a method for producing an optoelectronic semiconductor device. Especially, the optoelectronic semiconductor device is a radiation-emitting semiconductor device, for example an LED.

BACKGROUND

There exist different chip designs which are related by way of example to different mounting technologies. One possible chip design is a flip-chip design, where a semiconductor chip is mounted upside down and bondpads of different polarity for external electrical contacting are arranged on a same side of a semiconductor body of the semiconductor chip. The flip-chip design may involve a mesa structure, wherein a carrier of the chip is not covered by the semiconductor body and exposes irregularities. These irregularities impair the effect of mirror layers arranged on the mesa structure, and thus, when the semiconductor chip is mounted on a leadframe or printed circuit board, for example, the semiconductor chip suffers from light absorption at the leadframe or printed circuit board.

SUMMARY

Objects to be achieved within the present application are to specify an improved optoelectronic semiconductor device, where especially light absorption is reduced, as well as an improved method for producing an optoelectronic semiconductor device, where especially light absorption is reduced. These objects can be achieved inter alia by an optoelectronic semiconductor device having the features of the independent product claim as well as by a method having the features of the independent method claim.

According to at least one embodiment of an optoelectronic semiconductor device, the optoelectronic semiconductor device comprises a carrier comprising a patterned surface and comprises a semiconductor layer sequence arranged on the carrier. Within the context of the present application "patterned surface" means that the surface is structured in a predetermined way and especially has a regular, non-random pattern. For example, the patterned surface is arranged on a side of the carrier facing the semiconductor layer sequence. The patterned surface helps to increase a decoupling efficiency of the optoelectronic semiconductor device based on its roughness. Especially, the refractive index difference between the semiconductor layer sequence and the carrier is linearly reduced by a "transition layer" resulting at the patterned surface of the carrier.

Moreover, the semiconductor layer sequence comprises a first semiconductor layer having a first surface, a second semiconductor layer having a first surface, a first main surface and a second main surface opposite the first main surface. Furthermore, the semiconductor layer sequence comprises at least one side face connecting the first and second main surfaces. In particular, the first surfaces of the first and second semiconductor layers are at least partly arranged at the first main surface of the semiconductor layer sequence. In an embodiment, the second main surface faces the patterned surface of the carrier. In the context of the present application, "being arranged on" means following in a non-parallel, such as vertical, direction.

Moreover, the optoelectronic semiconductor device comprises a directionally reflective layer. In the context of the present application, "directionally reflective" designates a reflection property which is characterized in that a main part of radiation is reflected in one direction or within a small range of angles.

In addition, the optoelectronic semiconductor device comprises a planarization layer, wherein the planarization layer is arranged between the patterned surface and the directionally reflective layer. Advantageously, the planarization layer helps to level the irregularities existing at the patterned surface of the carrier.

In an advantageous embodiment, the carrier comprises structural elements at the patterned surface which are spaced by interspaces. In an embodiment, in a first region of the carrier, the planarization layer is arranged in the interspaces and in a vertical direction extends at least to upper ends of the structural elements. In an embodiment, the structural elements are completely embedded in the planarization layer in the first region of the carrier.

Especially, a surface of the planarization layer which faces the patterned surface in the first region has a pattern complementary to the one of the patterned surface. And a surface of the planarization layer which faces the directionally reflective layer in the first region, that is faces away from the patterned surface in the first region, especially has a planar or concavely curved shape. Advantageously, this configuration allows for applying the directionally reflective layer on a smooth surface and hence features a much higher reflection coefficient than without the planarization layer.

In a configuration of the optoelectronic semiconductor device, the planarization layer is arranged on the at least one side face of the semiconductor layer sequence. The planarization layer may cover the one or more side faces, such as all side faces of the semiconductor layer sequence, at least partly.

According to at least one embodiment, the planarization layer at least partly covers the first main surface of the semiconductor layer sequence. For example, the planarization layer may level the semiconductor layer sequence such that a surface where the directionally reflective layer is applied is planar.

According to at least one embodiment, the directionally reflective layer comprises a dielectric material or consists of a dielectric material. The directionally reflective layer may be a single layer or a multilayer comprising at least two sublayers of a higher and lower refractive index. In an embodiment, the directionally reflective layer is a DBR (Distributed Bragg Reflector) layer. Suitable materials for the directionally reflective layer or the sublayers are oxides like $SiO_2$, $TiO_2$, $Nb_2O_5$, $Al_2O_3$, for example, or nitrides like $Si_3N_4$ or $SiN_x$, for example, wherein "x" designates a non-stoichiometric amount of nitride, or fluorides like MgF2, for example. Suitable layer thicknesses of the directionally reflective layer are in the range between 500 nm and 6000 nm, such as in the range between 1000 nm and 5000 nm, or between 1500 nm and 4500 nm, wherein deviations of 10% are tolerable.

According to a configuration, in the first region, the carrier is laterally projecting beyond the second semiconductor layer. Especially, the first region of the carrier may be an edge region of the carrier which is not covered by the semiconductor layer sequence and laterally surrounds it in a plan view of the optoelectronic semiconductor device.

According to at least one embodiment, parts of the semiconductor layer sequence are arranged in the interspaces of the structural elements in a second region of the carrier.

In particular, the carrier is a growth substrate on which the semiconductor layer sequence has been epitaxially deposited. In this context, "epitaxial deposition on the growth substrate" means that the growth substrate is used for deposition and/or growth of the semiconductor layer sequence. For example, the second semiconductor layer is in direct contact with the patterned surface of the carrier. For example, the semiconductor layer sequence is applied to the whole patterned surface and later is removed in the first region. A first, deep mesa is produced by the removal of the semiconductor layer sequence in the first region, wherein surfaces of the semiconductor layer sequence at the first mesa may run obliquely, that is at an angle between 0° and 90°, to a main extension plane of the carrier.

The carrier or growth substrate may include or consist of sapphire, SiC and/or GaN. In an embodiment, the growth substrate consists of sapphire, and the optoelectronic semiconductor device is a miniature sapphire flip chip. Within the context of the present application, "miniature" refers to a size of about 200×200 $\mu m^2$. The directionally reflective layer allows flipping of the device and significantly high reflection to emit radiation laterally and from the top.

According to at least one embodiment, the planarization layer comprises at least one of SiO2 and spin-on glass. The spin-on glass (SOG) denotes a material which is applied to a wafer as a fluid containing SiO2 suspended in a solvent and which is hardened afterwards. Alternatively, the planarization layer may comprise a PECVD-SiO2 layer, which is applied by a Plasma-Enhanced Chemical Vapor Deposition process (PECVD), for example by High Density Plasma Chemical Vapor Deposition (HDPCVD). The light reflection at an interface between the semiconductor layer sequence and the planarization layer containing SiO2 or spin-on glass is lower than at an interface between the semiconductor layer sequence and the directionally reflective layer. As a result, the planarization layer containing SiO2 or spin-on glass increases the light extraction efficiency.

In an embodiment of the optoelectronic semiconductor device, the first semiconductor layer is of a first conductivity type and the second semiconductor layer is of a second conductivity type. Especially, the first semiconductor layer is a p-doped layer, whereas the second semiconductor layer is an n-doped layer. In an embodiment, an active zone is located between the first semiconductor layer and the second semiconductor layer. More layers, doped or undoped layers, may be arranged between the first semiconductor layer and the active zone as well as between the second semiconductor layer and the active zone. Moreover, the first and second semiconductor layers may be single layers or multilayers.

According to at least one embodiment, the active zone is provided for the generation of electromagnetic radiation. In this case, the term "electromagnetic radiation" refers in particular to infrared, visible and/or ultraviolet electromagnetic radiation. In particular, the active zone is provided for emitting blue or green light. During operation, a main portion of the radiation generated can be emitted laterally, which means at side faces of the optoelectronic semiconductor device. A smaller part of the radiation may be emitted on a top side of the optoelectronic semiconductor device.

Materials based on nitride compound semiconductors are suitable for the semiconductor layer sequence. "Based on nitride compound semiconductors" means in this context that at least one layer of the semiconductor layer sequence comprises a nitride III/V compound semiconductor material, such as $Al_bGa_mIn_{1-n-m}N$, where $0 \leq n \leq 1$, $0 \leq m \leq 1$ and $n+m \leq 1$, without necessarily having a mathematically exact composition according to the above formula. Rather, it may contain one or more dopants and additional components that do not substantially alter the characteristic physical properties of the $Al_nGa_mIn_{1-n-m}N$ material. For the sake of simplicity, however, the above formula contains only the essential components of the crystal lattice (Al, Ga, In, N), even if these can be partially replaced by small amounts of other substances.

According to at least one embodiment, the optoelectronic semiconductor device further comprises an omnidirectionally reflective layer arranged on a side of the directionally reflective layer facing away from the carrier. The omnidirectionally reflective layer may cover a region of the directionally reflective layer overlying at least a part of the second region of the carrier and/or at least a part of the first region of the carrier.

In the context of the present application, "omnidirectionally reflective" designates a reflection property which is characterized in that the radiation is mostly distributed regularly over all potential reflection angles.

Especially, the omnidirectionally reflective layer is a metallic layer. The omnidirectionally reflective layer may include Al, Rh or Ag. The omnidirectionally reflective layer may further reduce transmission losses.

According to at least one embodiment, the semiconductor layer sequence is patterned at the at least one side face such that it comprises structural elements. In an embodiment, the structural elements are arranged at one or all side faces of the second semiconductor layer. Moreover, the semiconductor layer sequence may be patterned at the first main surface such that it comprises structural elements. The structural elements may have the shape of prisms, for example. In particular, the patterned surfaces are roughened surfaces. A lateral light emission at the first, deep mesa area is increased in case of roughened surfaces using structural elements like prisms. This is beneficial, for example, for an application of a miniature sapphire flip-chip at a back lighting unit.

According to at least one embodiment, the second semiconductor layer laterally projects beyond the first semiconductor layer. In other words, the semiconductor layer sequence may comprise a second mesa on the first mesa, wherein surfaces of the semiconductor layer sequence at the second mesa may run obliquely, that is at an angle between 0° and 90°, to a main extension plane of the carrier. Especially, the second mesa is produced by the removal of an edge region of the semiconductor layer sequence.

The first and second mesas are for electrical isolation of the device's side wall.

According to at least one embodiment, the optoelectronic semiconductor device comprises a dielectric layer, which is arranged between the planarization layer and at least one of the semiconductor layer sequence and the carrier. In other words, the dielectric layer forms an interlayer between the planarization layer and at least one of the semiconductor layer sequence and the carrier. The dielectric layer may be a single layer or a multilayer. Thicknesses of the dielectric layer may range from 50 nm to 650 nm. The dielectric layer may comprise or consist of at least one of the following materials: Al2O3, SiO2, TiO2, silicon nitride, siliconoxynitride, Nb2O5, MgF2. For example, the dielectric layer is a multilayer and comprises a 40 to 120 nm thick sublayer of Al2O3 and a 50 to 500 nm thick sublayer of SiO2. For example, the dielectric layer is provided for passivation of the first mesa and for this purpose may comprise a layer of Al2O3 because Al2O3 is dense against humidity. Moreover, the dielectric layer may serve as an adhesion promoter for the planarization layer and for this purpose may comprise a layer of SiO2 because SiO2 is an adhesion promoter for spin-on glass.

In an advantageous embodiment, the optoelectronic semiconductor device comprises a first contact structure for electrically connecting the first semiconductor layer and a second contact structure for electrically connecting the second semiconductor layer. In an embodiment, the first contact structure comprises a first bondpad being arranged on a bottom side of the optoelectronic semiconductor device, and the second contact structure comprises a second bondpad being arranged on the bottom side, wherein the first and second bondpads are provided for externally contacting the optoelectronic semiconductor device. Especially, the first and second bondpads are each metallic layers. The first and second bondpads may each comprise several layers. For example, the first and second bondpads may each comprise at least one of the following layers: an adhesion layer, a reflective layer, a barrier layer and an encapsulation layer. Suitable materials for the adhesion layer are, for example, Ti, Cr, Al, Mo, Ni or W. Suitable materials for the reflective layer are, for example, Ag, Al or Rh. Suitable materials for the barrier layer are, for example, Ti, Pt, Ni, Cr, Rh or Ru. And the encapsulation layer may, for example, comprise or consist of Au.

According to at least one embodiment of a method for producing an optoelectronic semiconductor device, a carrier is provided comprising a patterned surface. Moreover, a semiconductor layer sequence is provided comprising a first semiconductor layer having a first surface, a second semiconductor layer having a first surface, a first main surface and a second main surface opposite the first main surface as well as at least one side face connecting the first and second main surfaces, wherein the first surfaces of the first and second semiconductor layers are at least partly arranged at the first main surface and wherein the second main surface faces the patterned surface of the carrier. Furthermore, a planarization layer is applied on the patterned surface. And a directionally reflective layer is applied on the planarization layer.

According to one advantageous aspect of the method, the planarization layer is formed by applying in a first region of the carrier a volume of spin-on glass on the patterned surface and rotating the carrier such that the spin-on glass covers the at least one side face. In particular, a volume of 4 to 5 ml can be applied to the wafer. Then, the wafer can be rotated, such as at a rotational speed of 1400 to 1600, especially 1500, rotations per minute. Afterwards, the volume of spin-on glass is hardened, such as at a temperature of 220 to 300° C. for about 100 min. The planarization layer produced in this way in particular has a thickness of 1.5 to 2 μm. The process of applying a volume of spin-on glass, rotating the wafer and hardening the volume of spin-on glass can be repeated several times to make the planarization layer thicker.

According to at least one embodiment, the planarization layer is formed by Plasma-Enhanced Chemical Vapor Deposition (PECVD) The planarization layer may be formed from SiO2 by PECVD with a Tetraethyl orthosilicate (TEOS) precursor. Especially, the planarization layer may be formed by High Density Plasma Chemical Vapor Deposition (HDPCVD). HDPCVD is a special form of PECVD that employs an Inductively Coupled Plasma (ICP) source to generate a higher plasma density than that of a standard parallel plate PECVD system. Higher plasma density provides several advantages including deposition at lower temperatures than PECVD, typically 80° C. to 150° C., higher quality films at lower temperatures and superior trench-fill capability to provide more planarized films. In an advantageous variant of the method, the semiconductor layer sequence is patterned at the at least one side surface by wet chemical etching such that it comprises structural elements.

In a configuration of the method, the semiconductor layer sequence is formed with a first and second mesa by an etching method, for example by dry chemical etching.

The method described above is particularly suitable for the production of optoelectronic semiconductor devices described here. Features described in connection with the device thus also apply to the method and vice versa.

The optoelectronic semiconductor device as described can be applied as a backlight unit for an LCD (Liquid Crystal Device) panel.

BRIEF DESCRIPTION OF THE DRAWINGS

Further features, embodiments and advantages are given in the following description of the exemplified embodiments in conjunction with the figures, in which.

Figure 1A:
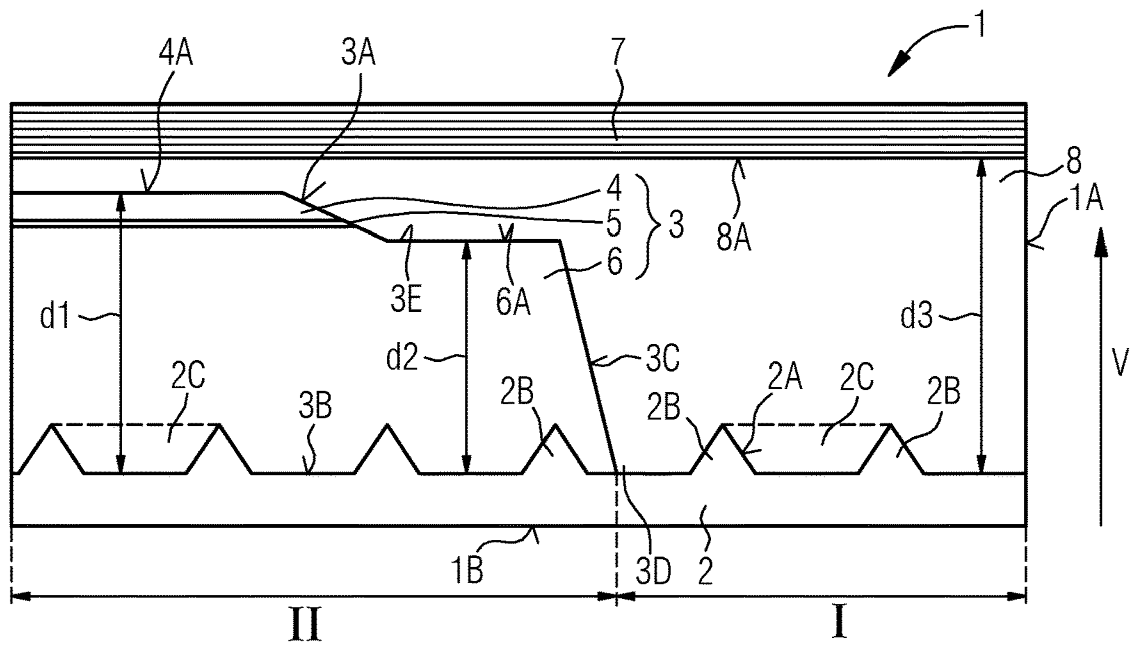
FIG. 1A shows a schematic cross-sectional view of a section of an optoelectronic semiconductor device according to a first embodiment and FIGS. 1B and 1C show schematic illustrations of microscope images of parts of cross sections of the optoelectronic semiconductor device according to the first embodiment.

In the exemplified embodiments and figures, identical, similar or similarly acting elements can each be provided with the same reference numerals. The elements shown and their proportions among each other are not necessarily to be regarded as true to scale; rather, individual elements may be oversized for better representability and/or better understanding.

DETAILED DESCRIPTION

Figure 1B:
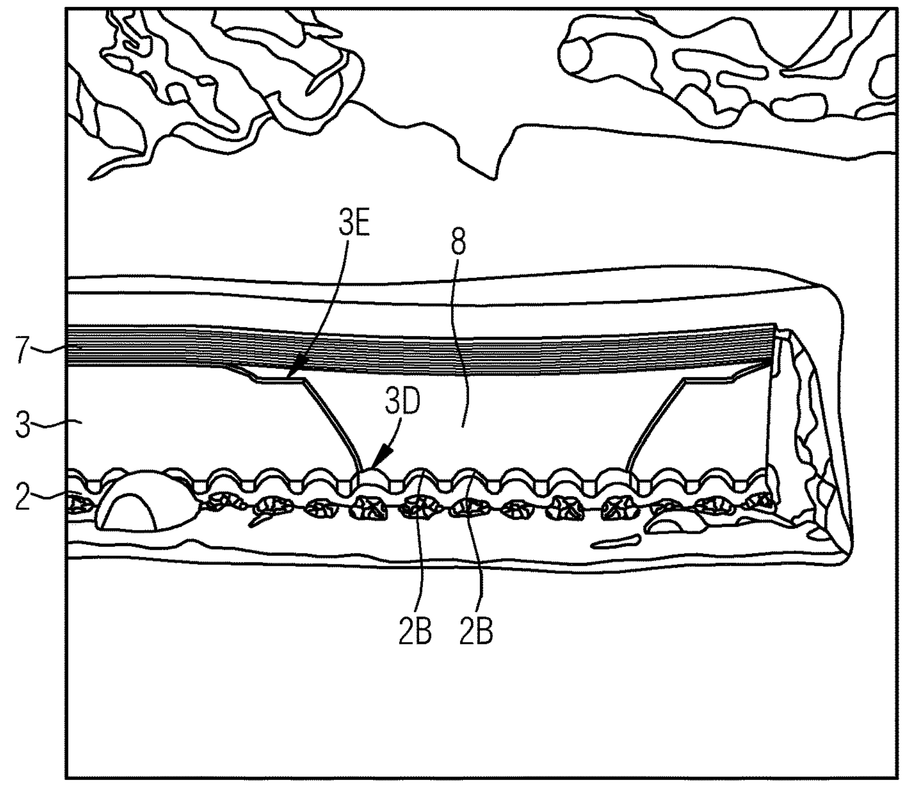
Figures 1C, 2:
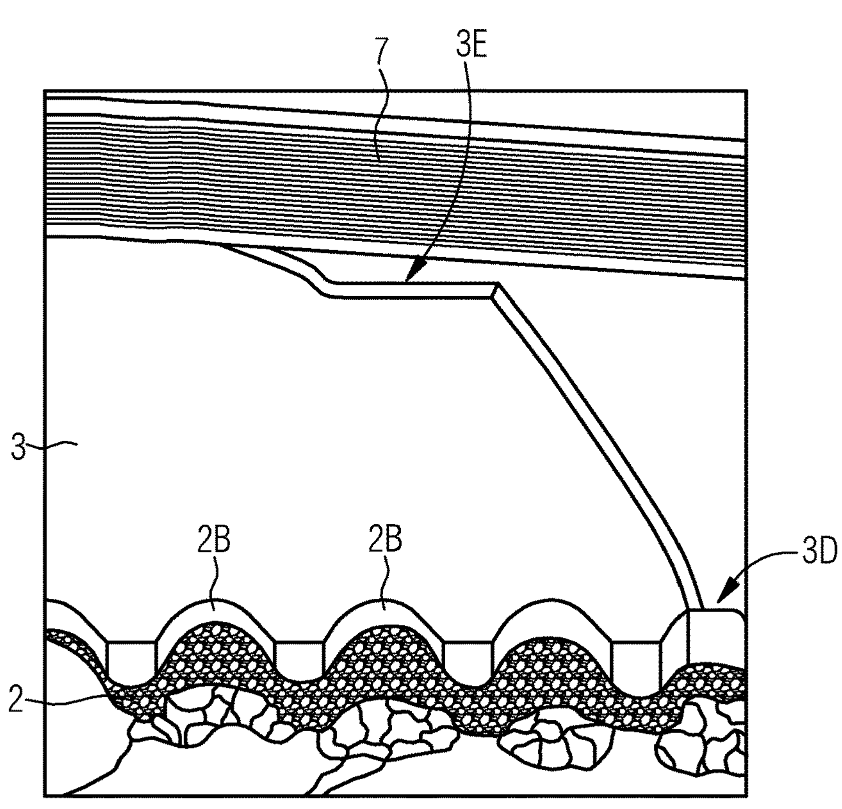
FIG. 2 shows a plan view of the optoelectronic semiconductor device according to the first embodiment in an unfinished state.

FIG. 1A shows a cross-sectional view of a section of an optoelectronic semiconductor device 1 along line AA' as indicated in FIG. 2. FIGS. 1B and 1C show schematic illustrations of microscope images of parts of cross sections of the optoelectronic semiconductor device 1 according to the first embodiment along line AA'. The images FIGS. 1B and 1C are based on have been made by means of a Focused Ion Beam (abbrev. "FIB") microscope at an acceleration velocity of 5.0 kV, wherein FIG. 1C shows an enlarged section of FIG. 1B.

The optoelectronic semiconductor device 1 comprises a carrier 2 and a semiconductor layer sequence 3 arranged on the carrier 2. In the context of the present application, "being arranged on" means following in a non-parallel direction, such as in a vertical direction V. A main extension plane of the carrier 2 is arranged perpendicularly to the vertical direction V.

The carrier 2 comprises a patterned surface 2A on a side facing the semiconductor layer sequence 3. At the patterned surface 2A, the surface of the carrier 2 is structured such that it comprises structural elements 2B. Especially, the structural elements 2B are arranged in a predetermined way, such as in a regular, non-random pattern. The patterned surface 2A helps to increase a decoupling efficiency of the optoelectronic semiconductor device 1 based on its roughness. Especially, the refractive index difference between the semiconductor layer sequence 3 and the carrier 2 is linearly reduced by a "transition layer" resulting at the patterned surface 2A of the carrier 2.

The semiconductor layer sequence 3 comprises a first semiconductor layer 4, which may be a p-doped layer, further comprises a second semiconductor layer 6, which may be an n-doped layer, and further comprises an active zone 5 arranged between the first and second semiconductor layers 4, 6. The first semiconductor layer 4 has a first surface 4A facing away from the second semiconductor layer 6. The second semiconductor layer 6 has a first surface 6A facing away from the carrier 2.

The semiconductor layer sequence 3 has a first main surface 3A and a second main surface 3B opposite the first main surface 3A. And the first surfaces 4A, 6A of the first and second semiconductor layers 4, 6 are at least partly arranged at the first main surface 3A of the semiconductor layer sequence 3. Especially, a part of the first surface 6A of the second semiconductor layer 6 is covered by the active zone 5 and the first semiconductor layer 4 and therefore is not arranged at the first main surface 3A. Moreover, the second main surface 3B faces the patterned surface 2A of the carrier 2 and may be in direct contact with the patterned surface 2A. The semiconductor layer sequence 3 further comprises at least one side face 3C connecting the first and second main surfaces 3A, 3B.

The semiconductor layer sequence 3 may include a material based on nitride compound semiconductors as mentioned above. And the active zone 5 is adapted for emitting blue or green light.

Moreover, the optoelectronic semiconductor device 1 comprises a directionally reflective layer 7, which is provided for reflecting a main part of radiation in a main direction or within a small range of angles.

As mentioned above, the directionally reflective layer 7 comprises a dielectric material or consists of a dielectric material. The directionally reflective layer 7 may be a single layer or a multilayer comprising at least two sublayers of a higher and lower refractive index. In an embodiment, the directionally reflective layer 7 is a DBR (Distributed Bragg Reflector) layer. Suitable materials for the directionally reflective layer 7 or the sublayers are oxides like SiO2, TiO2, Nb2O5, Al2O3, for example, or nitrides like Si3N4 or SiNx, for example, wherein "x" designates a non-stoichiometric amount of nitride, or fluorides like MgF2, for example. Suitable layer thicknesses of the directionally reflective layer are in the range between 500 nm and 6000 nm, such as in the range between 1000 nm and 5000 nm, such as between 1500 nm and 4500 nm, wherein deviations of 10% are tolerable.

In addition, the optoelectronic semiconductor device 1 comprises a planarization layer 8, wherein the planarization layer 8 is arranged between the patterned surface 2A and the directionally reflective layer 7. Advantageously, the planarization layer 8 helps to level the structural elements 2B or irregularities existing at the patterned surface 2A of the carrier 2. The planarization layer 8 comprises spin-on glass and is transparent to the radiation emitted from the active zone 5 during operation. The spin-on glass (SOG) denotes a material which is applied to a wafer as a fluid containing SiO2 suspended in a solvent and which is hardened afterwards. The portion of the solvent in the fluid may be between 0.5 and 0.7, such as ⅔.

In a first region I of the carrier 2, the planarization layer 8 is arranged in interspaces 2C between the structural elements 2A such that a surface of the planarization layer 8, which faces the patterned surface 2A in the first region I, has a pattern complementary to the one of the patterned surface 2A. And the structural elements 2B are completely embedded in the planarization layer 8 in the first region I of the carrier 2. In a second region II of the carrier 2, parts of the semiconductor layer sequence 3 are arranged in the interspaces 2C between the structural elements 2B. In an embodiment, the carrier 2 represents the growth substrate and may consist of sapphire.

The planarization layer 8 has a vertical extension d3 or thickness which exceeds a maximum vertical extension d1 or thickness of the semiconductor layer sequence 3. In other words, the planarization layer 8 protrudes from the semiconductor layer sequence 3 in the vertical direction V. For example, the maximum vertical extension d1 or thickness of the semiconductor layer sequence 3 may range between 5 and 12 μm, such as 9 μm. The planarization layer 8 is arranged on the side face(s) of the semiconductor layer sequence 3 and covers the first main surface 3A of the semiconductor layer sequence 3.

A surface 8A of the planarization layer 8 which faces the directionally reflective layer 7 has a planar shape within normal manufacturing tolerances. Advantageously, this configuration allows for applying the directionally reflective layer 7 on a smooth surface and hence features a much higher reflection coefficient than without the planarization layer (see the embodiments shown in FIGS. 3 to 7).

In an embodiment, the optoelectronic semiconductor device 1 is a miniature sapphire flip chip having a size of about 200×200 $\mu m^2$, wherein the directionally reflective layer 7 allows flipping of the device 1 and significantly high reflection to emit radiation laterally, which means at one or more side faces 1A of the optoelectronic semiconductor device 1, or from a top side 1B.

As becomes evident from FIGS. 1A, 1B, 1C and 2, the semiconductor layer sequence 3 comprises a first, deep mesa 3D and a second mesa 3E, wherein surfaces of the semiconductor layer sequence 3 at the mesas 3D, 3E run obliquely, that is at an angle between 0° and 90°, to the main extension plane of the carrier 2. The vertical extension d2 or thickness of the semiconductor layer sequence 3 at the first deep mesa 3E may range between 4 and 8 μm, such as 7 μm.

Moreover, the first semiconductor layer 4 comprises a recess 9, and the second semiconductor layer 6 is arranged at a bottom of the recess 9 (see FIG. 2).

In connection with FIGS. 3 to 6, the problems existing with a device which does not have a planarization layer are described in further detail.

Figure 4:
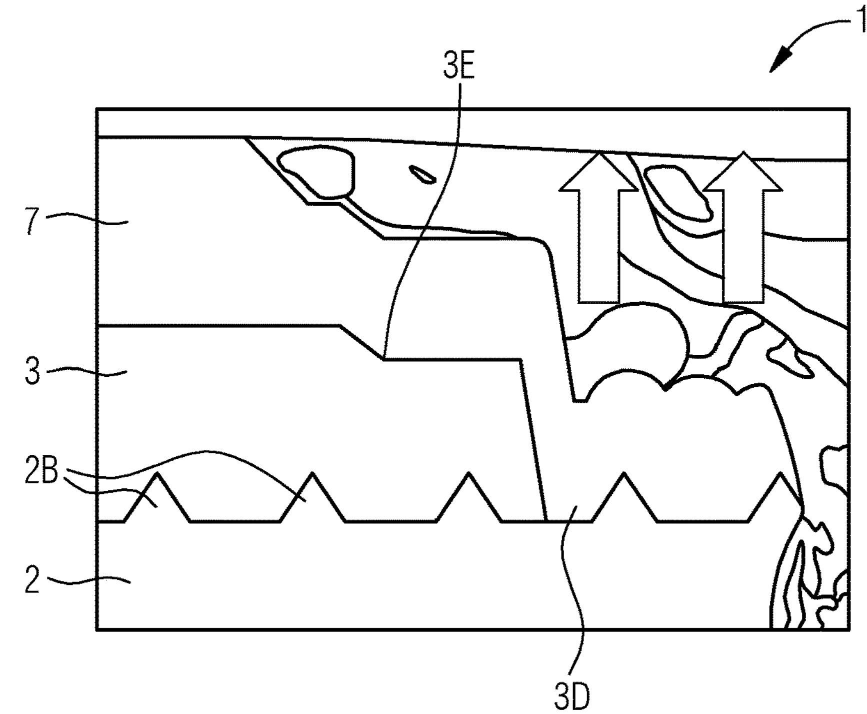

The image shown in FIG. 4 has been made by means of a Focused Ion Beam (abbrev. "FIB") microscope at an acceleration velocity of 500 kV and a width of 25.61 μm.

Figure 3:
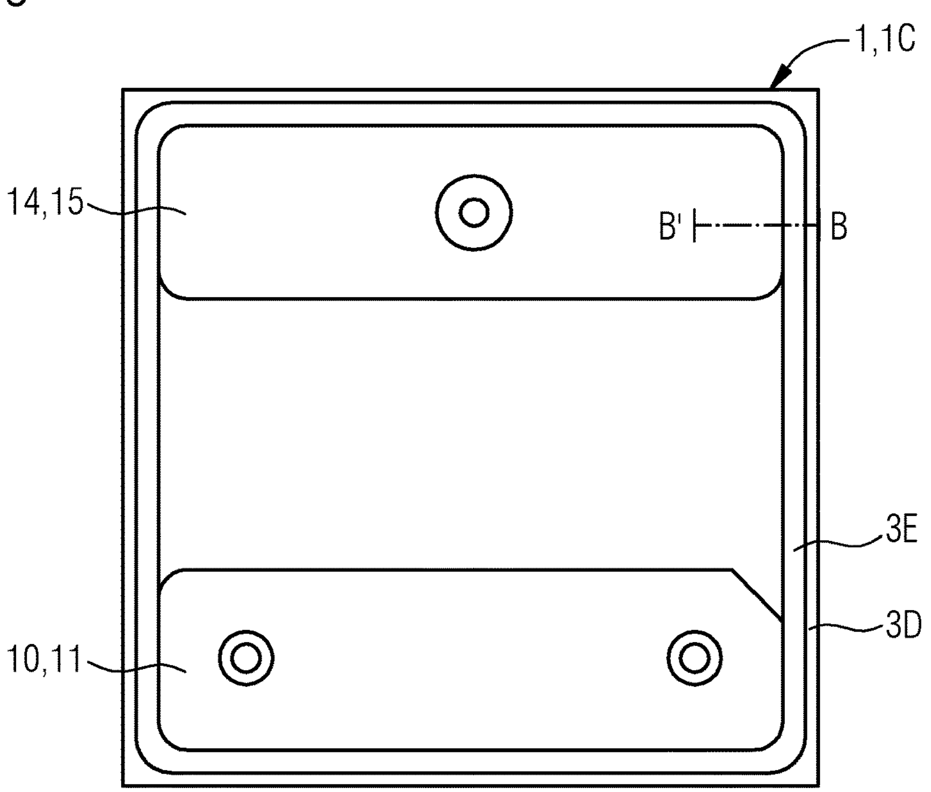
FIG. 3 shows a schematic illustration of a microscope image of a bottom side of an optoelectronic semiconductor device according to a comparative example and FIG. 4 shows a schematic illustration of a microscope image of a part of a cross-section of the optoelectronic semiconductor device according to the comparative example.

FIG. 3 shows a bottom side 1C of an optoelectronic semiconductor device 1 according to a comparative example comprising a semiconductor layer sequence having a first mesa 3D and a second mesa 3E. The optoelectronic semiconductor device 1 comprises a first contact structure 10 including a first bondpad 11 and a second contact structure 14 including a second bondpad 15.

FIG. 4 shows a cross section taken along line B'B of the optoelectronic semiconductor device 1 shown in FIG. 3. The optoelectronic semiconductor device 1 comprises a directionally reflective layer 7, which is about 4 μm thick, a semiconductor layer sequence 3 and a carrier 2 having structural elements 2B. The rough carrier 2 reduces the effective reflection coefficient of the directionally reflective layer 7 at the first deep mesa 3D. As a result, a higher transmission of radiation (see arrows) and hence a higher light intensity is created on a non-reflective board where the optoelectronic semiconductor device 1 may be mounted.

Figure 5:
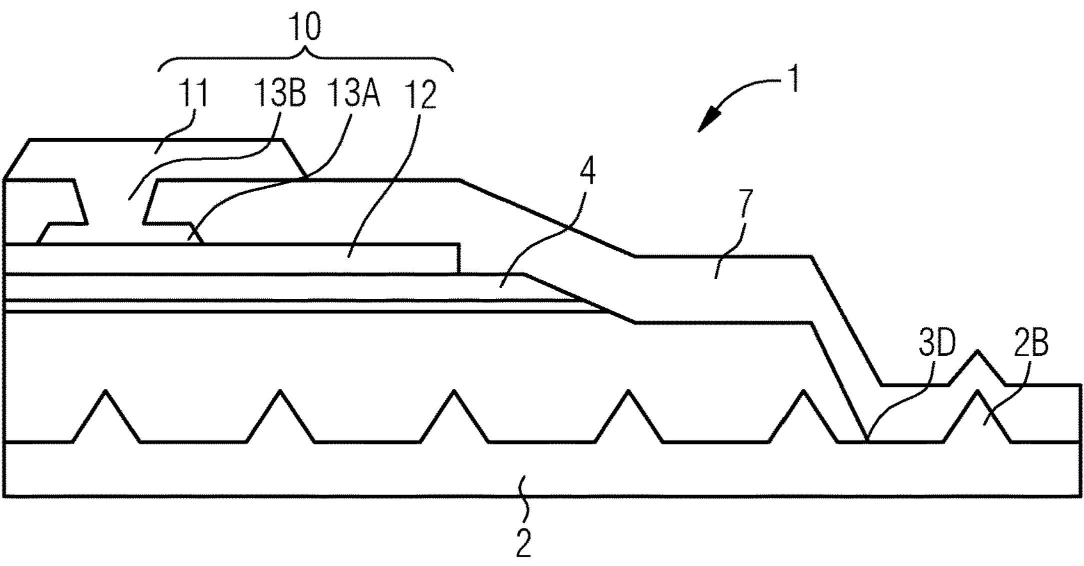
FIGS. 5 and 6 show schematic cross-sectional views of sections of optoelectronic semiconductor devices according to different comparative examples.
Figure 6:
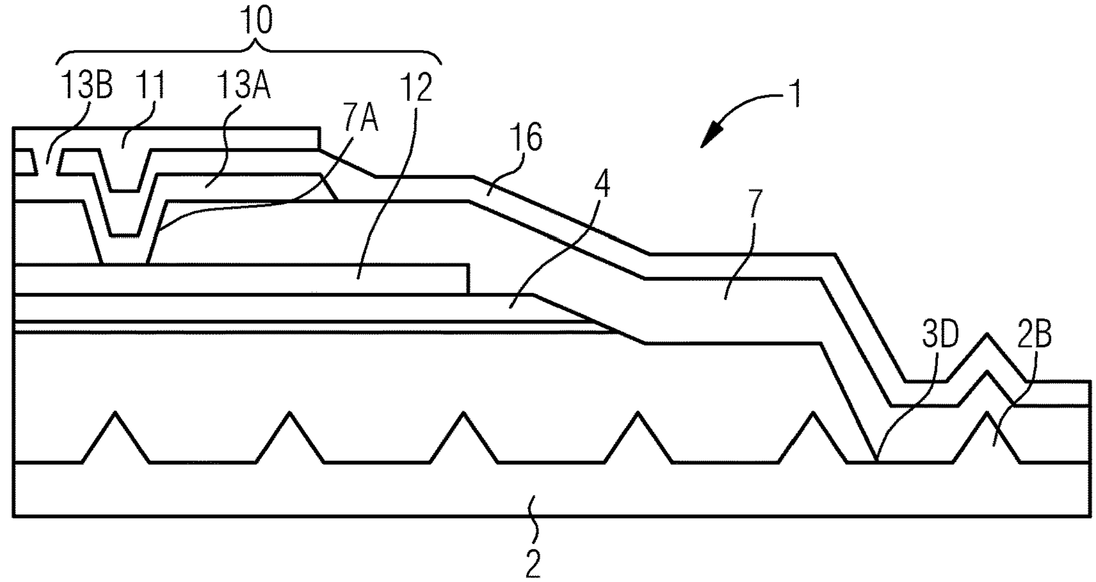

FIGS. 5 and 6 show schematic cross-sectional views of optoelectronic semiconductor devices 1 according to comparative examples, where at the first mesa 3D the directionally reflective layer 7 is rough as a consequence of the rough carrier 2.

The optoelectronic semiconductor device 1 according to the example shown in FIG. 5 comprises a first contact structure 10 including a TCO layer 12 directly applied to the first semiconductor layer 4.

TCOs are transparent conductive materials, usually metal oxides such as zinc oxide, tin oxide, cadmium oxide, titanium oxide, indium oxide or indium tin oxide (ITO). In addition to binary metal oxygen compounds such as ZnO, SnO2 or In2O3, ternary metal oxygen compounds such as Zn2SnO4, CdSnO3, ZnSnO3, MgIn2O4, GaInO3, Zn2In2O5 or In4Sn3O12 or mixtures of different transparent conductive oxides also belong to the group of TCOs. Furthermore, the TCOs do not necessarily correspond to a stoichiometric composition and can also be p- or n-doped.

Moreover, the first contact structure 10 includes a metal layer 13A arranged on the TCO layer 12 and a metal via 13B arranged between the TCO layer 12 and the bondpad 11. In accordance with the first contact structure 10, the second contact structure 14 may also include a TCO layer and a metal via (not shown) arranged between the TCO layer and the bondpad 15. In particular, the metal vias 13B are composed of the same material as the bondpads 11, 15.

Especially, the metal via(s) 13B are laterally surrounded by the directionally reflective layer 7. The metal via(s) 13B and/or bondpads 11, 15 may have a non-neglectable impact on the overall reflection occurring in the device 1.

The optoelectronic semiconductor device 1 according to the example shown in FIG. 6 comprises a first contact structure 10 including a TCO layer 12 directly applied to the first semiconductor layer 4. Moreover, the first contact structure 10 includes a metal layer 13A arranged in a recess 7A of the directionally reflective layer 7 and contacting the TCO layer 12 at a bottom of the recess 7A. A metal via 13B is arranged between the metal layer 13A and the bondpad 11, wherein the metal via 13B is embedded in a passivation layer 16 arranged between the metal layer 13A and the bondpad 11.

In accordance with the first contact structure 10, the second contact structure 14 may also include a TCO layer, a metal layer and a metal via (not shown).

The optoelectronic semiconductor device 1 described herein in accordance with the embodiments shown in FIGS. 1 and 7 to 16 may comprise first and second contact structures as described in accordance with FIGS. 3 to 6.

In connection with FIGS. 7 to 16, further embodiments of optoelectronic semiconductor devices 1 are described. Especially, differences to the first embodiment of an optoelectronic semiconductor device 1 will be explained.

Figure 7:
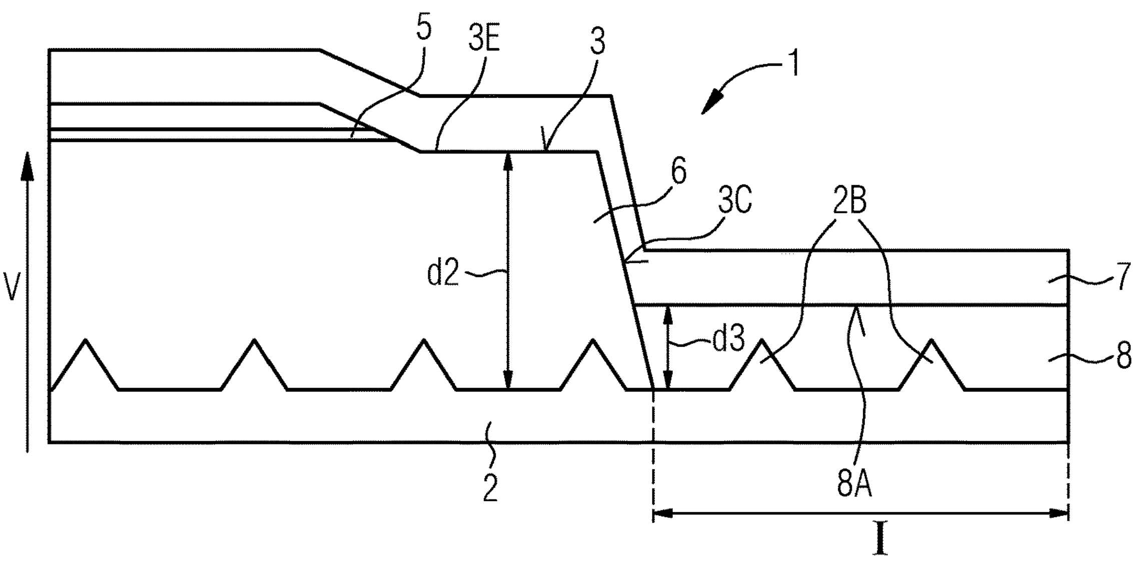
FIGS. 7 to 15 show schematic cross-sectional views of sections of optoelectronic semiconductor devices according to different embodiments.

The optoelectronic semiconductor device 1 according to the second embodiment of FIG. 7 comprises a planarization layer 8 which covers the first region I of the carrier 2 and extends beyond upper ends of the structural elements 2B, but does not extend beyond the second semiconductor layer 6 in the vertical direction V. The planarization layer 8 may have a thickness d3 between 2 μm and 3 μm, such as 2.5 μm. Moreover, the structural elements 2B may have a vertical extension of about 2 μm. The side faces 3C of the semiconductor layer sequence 3 are only partly covered by the planarization layer 8.

The coverage of the structural elements 2B by the planarization layer 8 is sufficient to produce a smooth surface 8A where the directionally reflective layer 7 is applied and leads to reduced transmission losses. Given the thickness d3 of 2 μm to 3 μm, it is possible to produce the planarization layer 8 in few, especially one or two, process steps.

Figure 8:
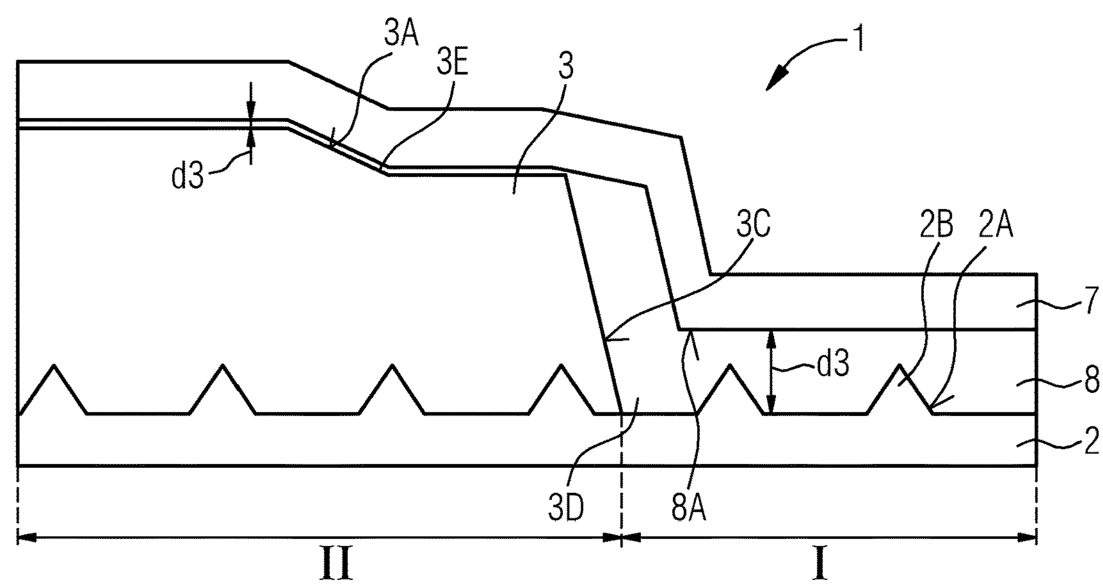

The optoelectronic semiconductor device 1 according to the third embodiment of FIG. 8 comprises a planarization layer 8 which covers the first and second regions I, II of the carrier 2. Especially, the planarization layer 8 extends from the patterned surface 2A in the first region I, over the side face(s) 3C of the semiconductor layer sequence 3 to the first main surface 3A of the semiconductor layer sequence 3. In an embodiment, the side face(s) 3C and the first main surface 3A of the semiconductor layer sequence 3 are completely covered by the planarization layer 8. Moreover, the structural elements 2B are completely embedded in the planarization layer 8.

In an embodiment, the thickness d3 of the planarization layer 8 is smaller on the first main surface 3A than on the side face(s) 3C. And the thickness d3 of the planarization layer 8 is smaller on the side face(s) 3C than on the patterned surface 2A in the first region I. This may be a consequence of the production process, wherein the material volume for producing the planarization layer 8 is arranged on the first mesa 3D and rotated such that it creeps from the patterned surface 2A over the side face(s) 3C to the first main surface 3A of the semiconductor layer sequence 3.

In addition to the advantage of reduced transmission losses brought about by the smooth surface 8A of the planarization layer 8 facing the directionally reflective layer 7 in the first region I, the planarization layer 8 of the third embodiment has the effect of electrical insulation of the first and second mesas 3D, 3E.

Figure 9:
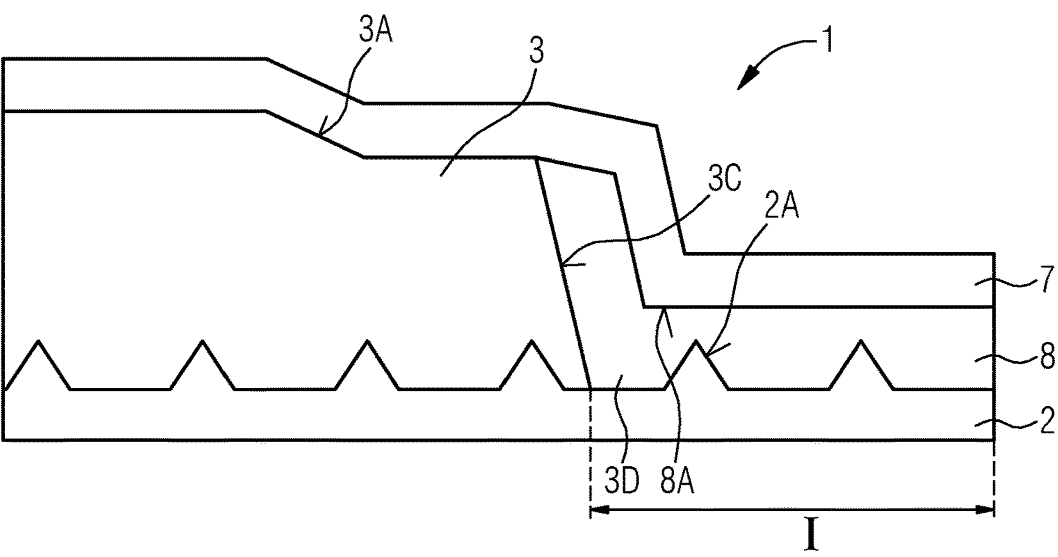

The optoelectronic semiconductor device 1 according to the fourth embodiment of FIG. 9 comprises a planarization layer 8, which extends from the patterned surface 2A in the first region I to the side face(s) 3C of the semiconductor layer sequence 3. Especially, the side face(s) 3C of the semiconductor layer sequence 3 is/are completely covered by the planarization layer 8, wherein the first main surface 3A is free of the planarization layer 8.

Advantageously, the smooth surface 8A of the planarization layer 8 facing the directionally reflective layer 7 in the first region I helps to reduce transmission losses and thus reduces light absorption.

Figure 10:
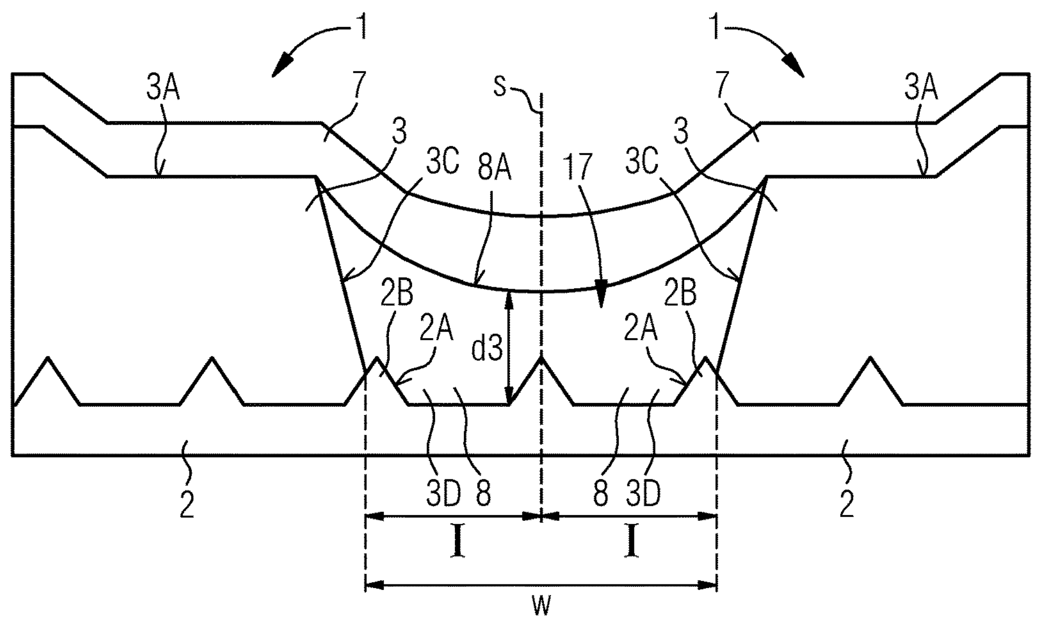

FIG. 10 shows an assembly of optoelectronic semiconductor devices 1 according to a fifth embodiment before singulation along a singulation line S or dicing trench. The material volume for producing the planarization layers 8 of the optoelectronic semiconductor devices 1 may be arranged on the first mesas 3D of adjacent optoelectronic semiconductor devices 1, wherein the first mesas 3D together form a recess 17 where the material volume is collected. The recess 17 is narrow, having a width w of 15 μm to 25 μm, such as 20 μm, so that the material volume which is creeping the side faces 3C during rotation is formed with a concavely curved surface 8A. Thus, in the finished optoelectronic semiconductor devices 1, the surface 8A of the planarization layer 8 facing the directionally reflective layer 7 is concavely curved. And the directionally reflective layer 7 applied thereon also has a concavely curved shape. The thus formed planarization layer 8 in each case covers the patterned surface 2A in the first region I and the side face 3C, but leaves free the first main surface 3A. Moreover, the structural elements 2B are completely embedded in the planarization layer 8. In an embodiment, the thickness d3 of the planarization layer 8 in each case is between 3 μm to 5 μm, such as 4 μm.

Figure 11:
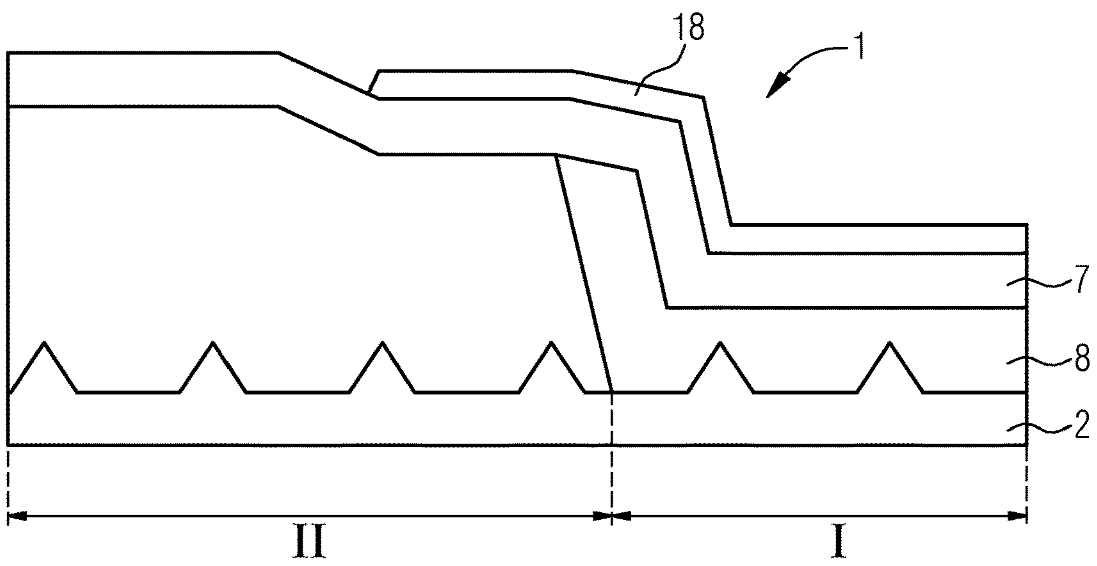
Figure 12:
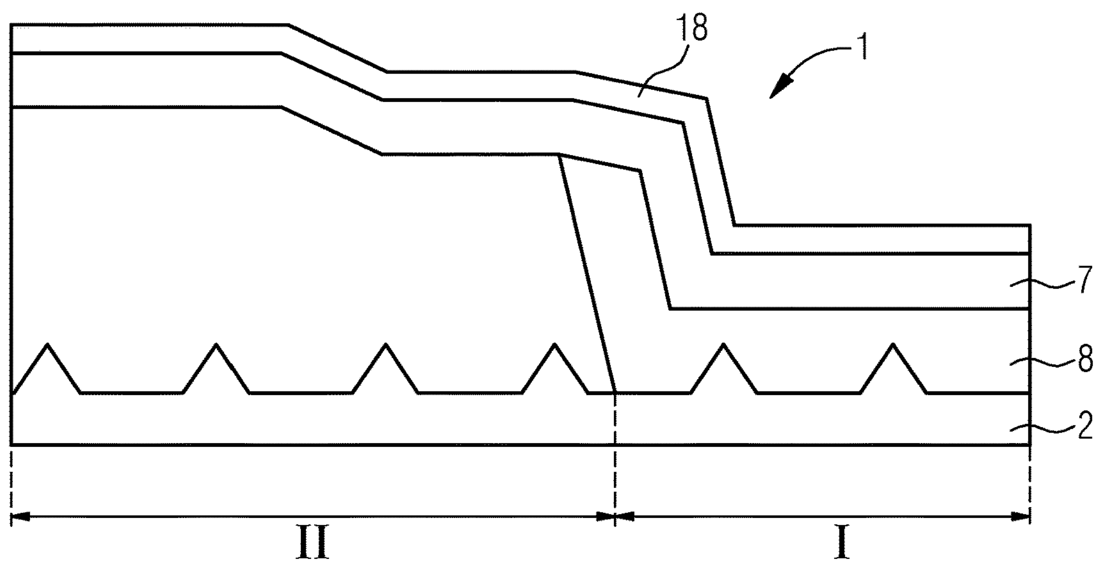
Figure 13:
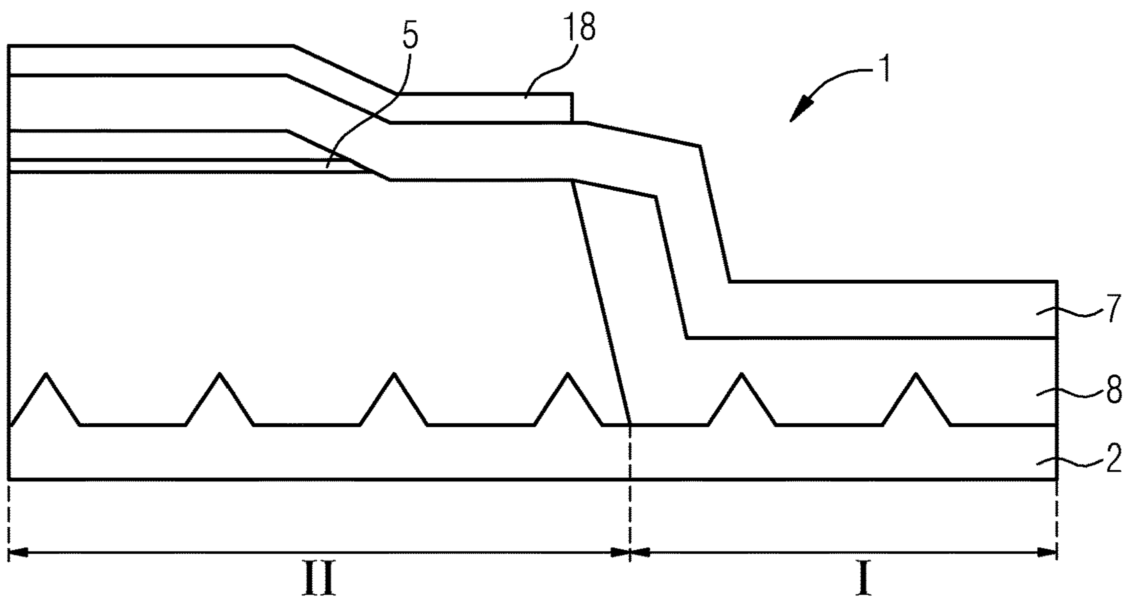

The optoelectronic semiconductor devices 1 shown in FIGS. 11 to 13 are basically embodied as in the fifth embodiment, but in addition comprise an omnidirectionally reflective layer 18 arranged on a side of the directionally reflective layer 7 facing away from the carrier 2. Especially, the omnidirectionally reflective layer 18 is a metallic layer. The omnidirectionally reflective layer 18 may include Al, Rh or Ag. The omnidirectionally reflective layer 18 may further reduce transmission losses.

In the sixth embodiment shown in FIG. 11, the omnidirectionally reflective layer 18 covers a region of the directionally reflective layer 7 overlying the first region I of the carrier 2 and a part of the second region II. Thus, transmission losses in the first region I are further reduced.

In the seventh embodiment shown in FIG. 12, the omnidirectionally reflective layer 18 covers a region of the directionally reflective layer 7 overlying the first and second regions I, II of the carrier 2 and thus providing for high reflectivity all over the device 1.

In the eighth embodiment shown in FIG. 13, the omnidirectionally reflective layer 18 covers a region of the directionally reflective layer 7 overlying the second region II of the carrier 2 and thus provides for good reflectivity in the radiation-generating region where the active zone 5 is arranged.

Figure 14:
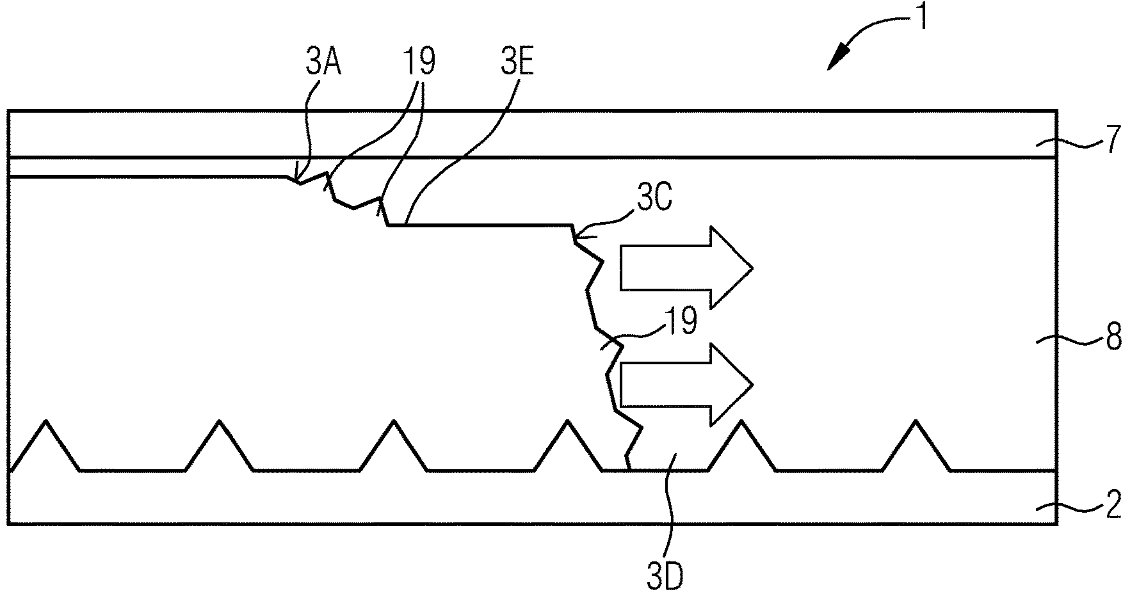

The optoelectronic semiconductor device 1 shown in FIG. 14 is basically embodied as in the first embodiment, but in addition comprises structural elements 19 at the side face(s) 3C as well as at the first main surface 3A. The structural elements 19 may have the shape of prisms, for example. In an embodiment, the structural elements 19 have a size from nanoscale to a few microns. The structural elements 19 arranged at the first mesa 3D as well as at the second mesa 3E increase the light extraction efficiency there (see arrows).

Figures 15, 16:
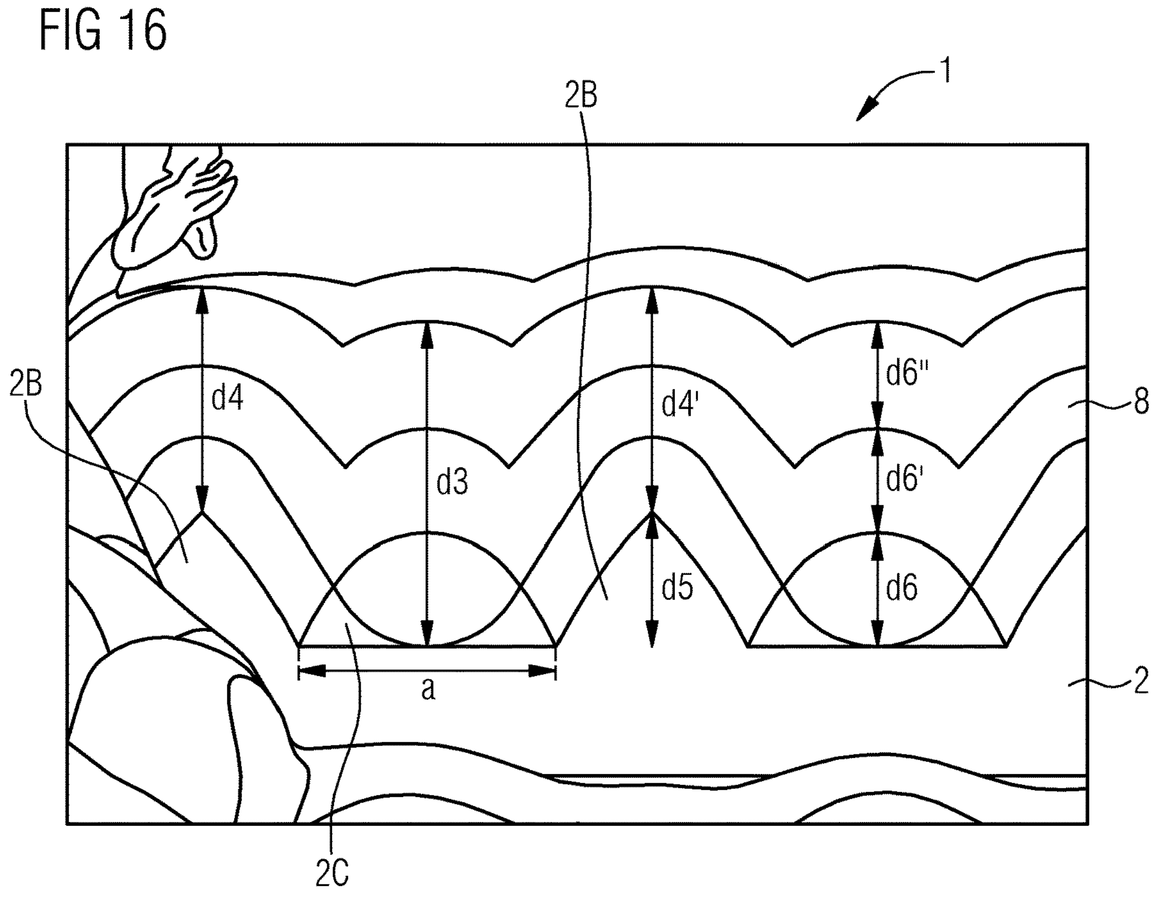
FIG. 16 shows a schematic illustration of a microscope image of a part of a cross-section of an optoelectronic semiconductor device according to a further embodiment.

The optoelectronic semiconductor device 1 shown in FIG. 15 is basically embodied as in the first embodiment, but in addition comprises a dielectric layer 20, which is arranged between the planarization layer 8 and the semiconductor layer sequence 3 and the carrier 2. The dielectric layer 20 covers the carrier 2 in the first region I. Moreover, the dielectric layer 20 covers the side faces 3C and the first main surface 3A of the semiconductor layer sequence 3.

The dielectric layer 20 may be a single layer or a multilayer. Thicknesses of the dielectric layer 20 may range from 50 nm to 650 nm. The dielectric layer 20 may comprise or consist of at least one of the following materials: Al2O3, SiO2, TiO2, silicon nitride, siliconoxynitride, Nb2O5, MgF2. For example, the dielectric layer 20 is a multilayer and comprises a 40 to 120 nm thick sublayer of Al2O3 and a 50 to 500 nm thick sublayer of SiO2. For example, the dielectric layer 20 is provided for passivation of the first mesa 3D and may comprise a layer of Al2O3 for this purpose because Al2O3 is dense against humidity. Moreover, the dielectric layer 20 may serve as an adhesion promoter of the planarization layer 8 and may comprise a layer of SiO2 for this purpose because SiO2 is an adhesion promoter for spin-on glass. FIG. 16 shows a schematic illustration of a microscope image of a part of a cross-section of an optoelectronic semiconductor device according to a further embodiment. The image, where FIG. 16 is based on, has been made by means of a Focused Ion Beam (abbrev. "FIB") microscope at an acceleration velocity of 2.0 kV.

The optoelectronic semiconductor device 1 shown in FIG. 16 is basically embodied as in the first embodiment, but comprises a planarization layer 8 containing SiO2 and formed by a PECVD method with TEOS precursor. The planarization layer 8 has a vertical extension d3 of about 3.6 μm between the structural elements 2B and a vertical extension d4 of about 2.6 μm on top of the structural elements 2B. So, the vertical extension d4 is reduced by about 1 μm with respect to the vertical extension d3. A vertical extension d5 of the structural elements 2B is about 1.5 μm. The interspace 2C between two structural elements 2B may have a lateral extension a of about 2.9 μm. In general, the thicker the planarization layer 8 is, the lower the difference in the vertical extension becomes. In the embodiment shown in FIG. 16, the planarization layer 8 comprises three partial layers, wherein the first partial layer closest to the carrier 2 has a thickness d6 of about 1.2 μm, the second partial layer arranged on the first partial layer has a thickness d6' of about 1.15 μm and the third partial layer arranged on the second partial layer has a thickness d6" of about 1.23 μm.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

REFERENCES

1 optoelectronic semiconductor device
1A side face
1B top side
1C bottom side
2 carrier
2A patterned surface
2B structural element 2C interspace
3 semiconductor layer sequence
3A first main surface
3B second main surface
3C side face
3D first mesa
3E second mesa
4 first semiconductor layer
4A first surface of first semiconductor layer
5 active zone
6 second semiconductor layer
6A first surface of second semiconductor layer
7 directionally reflective layer
7A recess
8 planarization layer
8A surface
9 recess
10 first contact structure
11 bondpad of first contact structure
12 TCO layer
13A metal layer
13B metal via
14 second contact structure
15 bondpad of second contact structure
16 passivation layer
17 recess
18 omnidirectionally reflective layer
19 structural element
20 dielectric layer
I first region of the carrier
II second region of the carrier
a lateral extension
d1, d2, d3, d4, d4', d5, d6, d6', d6" vertical extension
S singulation line
V vertical direction
w width

The invention claimed is:

1. An optoelectronic semiconductor device comprising:
a carrier comprising a patterned surface;
a semiconductor layer sequence arranged on the carrier, the semiconductor layer sequence comprising:
a first semiconductor layer having a first surface;
a second semiconductor layer having a first surface;
a first main surface and a second main surface opposite the first main surface, wherein the first surfaces of the first and second semiconductor layers are at least partly arranged at the first main surface, and wherein the second main surface faces the patterned surface of the carrier;
at least one side face connecting the first and second main surfaces;
a directionally reflective layer; and
a planarization layer arranged between the patterned surface and the directionally reflective layer, wherein the patterned surface is arranged on a side of the carrier facing the semiconductor layer sequence,
wherein the carrier comprises structural elements at the patterned surface spaced by interspaces; wherein, in a first region of the carrier, the planarization layer is arranged in the interspaces and in a vertical direction extends at least to upper ends of the structural elements.

2. The optoelectronic semiconductor device according to claim 1, wherein, in the first region, the planarization layer comprises a surface facing the directionally reflective layer; wherein the surface has a planar or concavely curved shape.

3. The optoelectronic semiconductor device according to claim 1, wherein, in the first region, the carrier is laterally projecting beyond the second semiconductor layer.

4. The optoelectronic semiconductor device according to claim 1, wherein parts of the semiconductor layer sequence are arranged in the interspaces of the structural elements in a second region of the carrier.

5. The optoelectronic semiconductor device according to claim 1, wherein the planarization layer comprises at least one of $SiO_2$ and spin-on glass.

6. The optoelectronic semiconductor device according to claim 1, wherein the planarization layer is arranged on the at least one side face of the semiconductor layer sequence.

7. The optoelectronic semiconductor device according to claim 1, wherein the planarization layer at least partly covers the at least one side face of the semiconductor layer sequence.

8. The optoelectronic semiconductor device according to claim 1, wherein the planarization layer at least partly covers the first main surface of the semiconductor layer sequence.

9. The optoelectronic semiconductor device according to claim 1, further comprising an omnidirectionally reflective layer arranged on a side of the directionally reflective layer facing away from the carrier.

10. The optoelectronic semiconductor device according to claim 1, wherein the semiconductor layer sequence is patterned at the at least one side face such that it comprises structural elements.

11. The optoelectronic semiconductor device according to claim 1, wherein the second semiconductor layer laterally projects beyond the first semiconductor layer.

12. The optoelectronic semiconductor device according to claim 1, further comprising a dielectric layer arranged between the planarization layer and at least one of the semiconductor layer sequence and the carrier.

13. The optoelectronic semiconductor device according to claim 1, wherein the semiconductor layer sequence is arranged in a second region of the carrier different from the first region of the carrier.

14. A method for producing an optoelectronic semiconductor device; wherein the method comprises:
providing a carrier comprising a patterned surface;
providing a semiconductor layer sequence comprising:
a first semiconductor layer having a first surface;
a second semiconductor layer having a first surface;
a first main surface and a second main surface opposite the first main surface, wherein the first surfaces of the first and second semiconductor layers are at least partly arranged at the first main surface, and wherein the second main surface faces the patterned surface of the carrier;
at least one side face connecting the first and second main surfaces,
applying a planarization layer on the patterned surface; and
applying a directionally reflective layer on the planarization layer,
wherein the carrier comprises structural elements at the patterned surface spaced by interspaces; wherein, in a first region of the carrier, the planarization layer is arranged in the interspaces and in a vertical direction extends at least to upper ends of the structural elements.

15. The method according to claim 14, further comprising applying in a first region of the carrier a volume of spin-on glass on the patterned surface and rotating the carrier such that the spin-on glass covers the at least one side face to form the planarization layer.

16. The method according to claim 14, wherein the planarization layer is formed by Plasma-Enhanced Chemical Vapor Deposition.

17. The method according to claim 14, wherein the semiconductor layer sequence is patterned at the at least one side surface by wet chemical etching such that it comprises structural elements.

* * * * *